(12) United States Patent
Jakubowski et al.

(10) Patent No.: US 8,716,102 B2
(45) Date of Patent: May 6, 2014

(54) METHODS OF FORMING ISOLATION STRUCTURES FOR SEMICONDUCTOR DEVICES BY PERFORMING A DRY CHEMICAL REMOVAL PROCESS

(75) Inventors: Frank Jakubowski, Dresden (DE); Joerg Radecker, Dresden (DE); Joanna Wasyluk, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/584,981

(22) Filed: Aug. 14, 2012

(65) Prior Publication Data

US 2014/0051227 A1 Feb. 20, 2014

(51) Int. Cl.
*H01L 27/092* (2006.01)

(52) U.S. Cl.
USPC ............... 438/424; 257/369; 257/E21.546; 257/E27.062; 257/E21.409

(58) Field of Classification Search
USPC ............. 438/199, 218, 285, 296, 424, 430
See application file for complete search history.

(56) References Cited

U.S. PATENT DOCUMENTS

| | | | |
|---|---|---|---|
| 2002/0098661 A1* | 7/2002 | Cha et al. | 438/424 |
| 2005/0196928 A1* | 9/2005 | Bonser et al. | 438/296 |
| 2010/0237432 A1* | 9/2010 | Takeoka et al. | 257/369 |
| 2010/0255654 A1* | 10/2010 | Lin et al. | 438/424 |

* cited by examiner

*Primary Examiner* — Chuong A Luu
*Assistant Examiner* — Rodolfo Fortich
(74) *Attorney, Agent, or Firm* — Amerson Law Firm, PLLC

(57) ABSTRACT

A method includes forming a patterned mask comprised of a polish stop layer positioned above a protection layer above a substrate, performing at least one etching process through the patterned mask layer on the substrate to define a trench in the substrate, and forming a layer of silicon dioxide above the patterned mask layer such that the layer of silicon dioxide overfills the trench. The method also includes removing portions of the layer of silicon dioxide positioned outside of the trench to define an isolation structure, performing a dry, selective chemical oxide etching process that removes silicon dioxide selectively relative to the material of the polish stop layer to reduce an overall height of the isolation structure, and performing a selective wet etching process to remove the polish stop layer selectively relative to the isolation region.

13 Claims, 6 Drawing Sheets

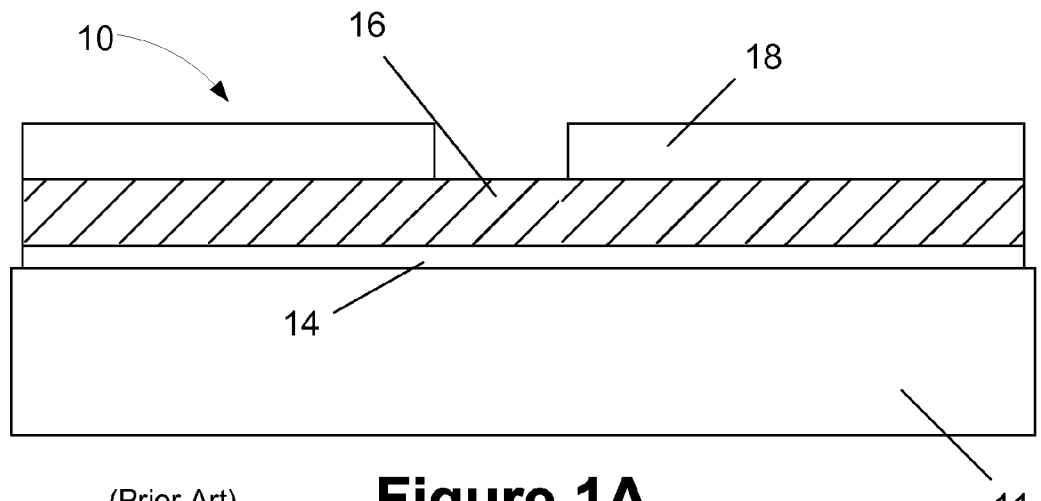
(Prior Art) Figure 1A
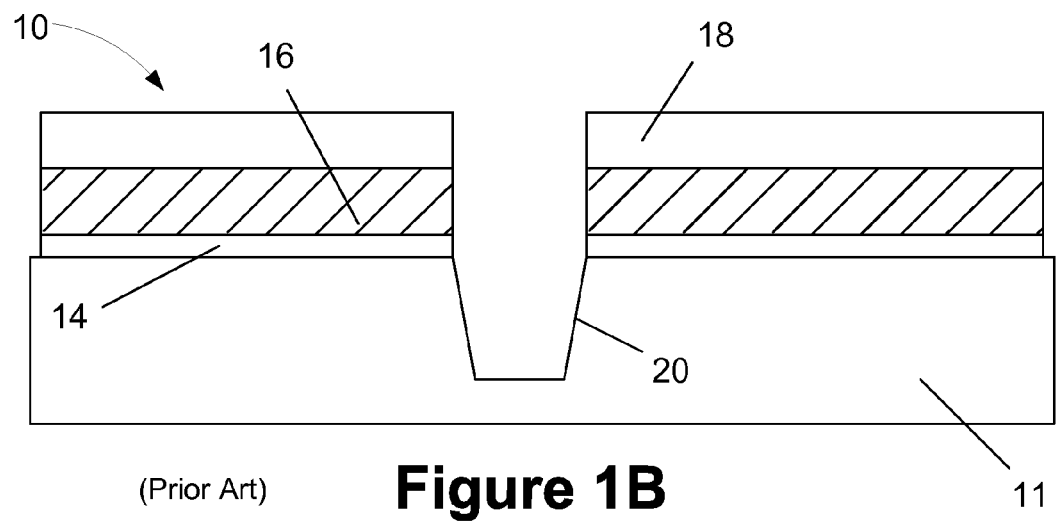
(Prior Art) Figure 1B

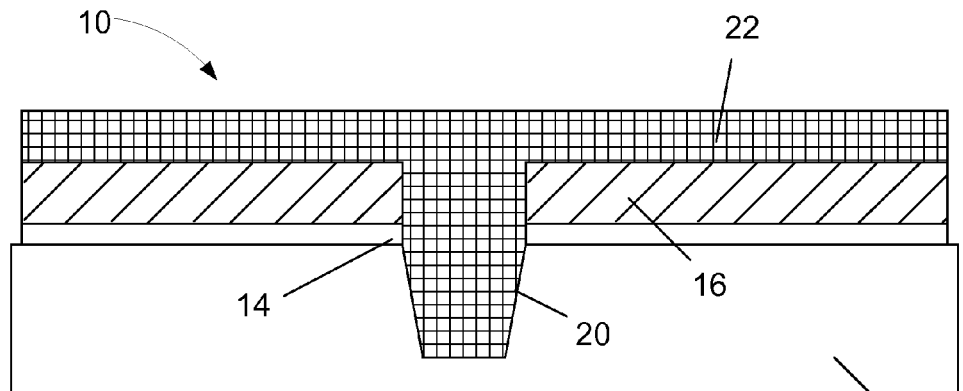
(Prior Art) Figure 1C
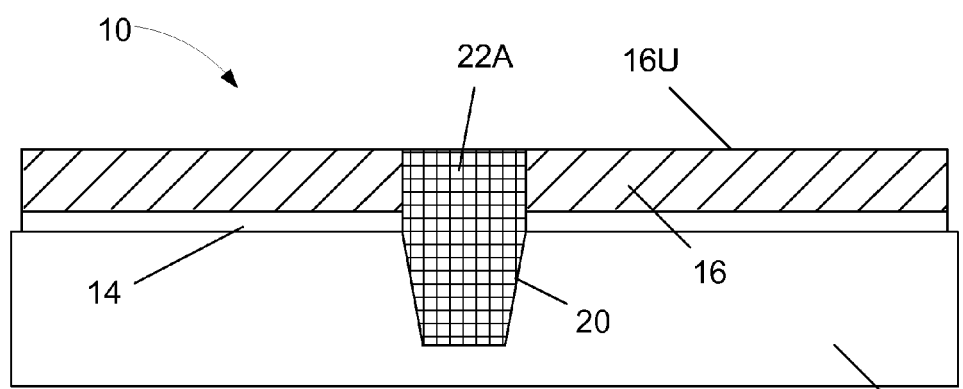
(Prior Art) Figure 1D
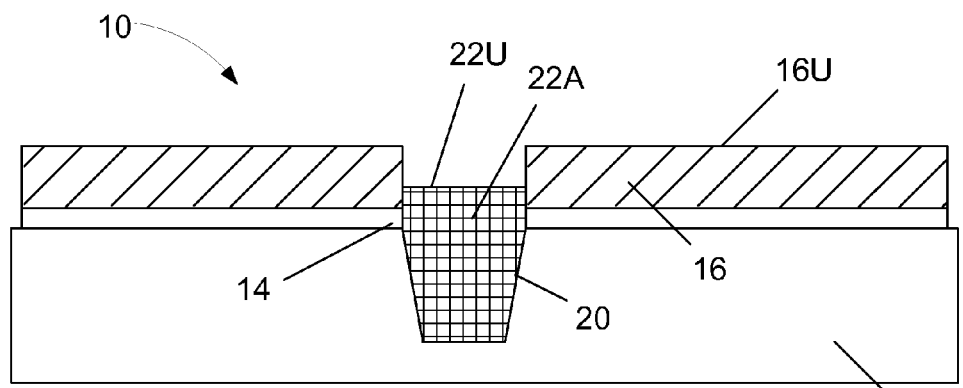
(Prior Art) Figure 1E

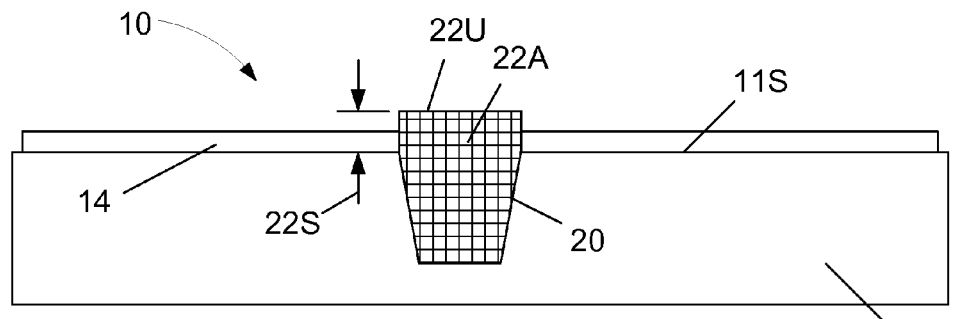
(Prior Art) Figure 1F
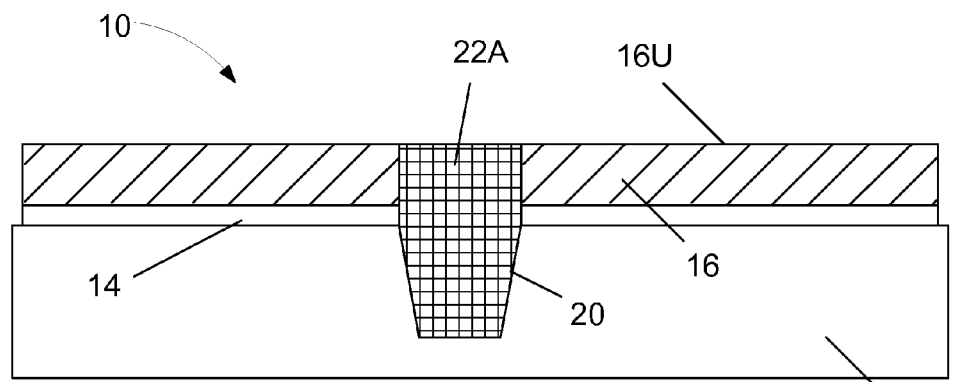
(Prior Art) Figure 2A
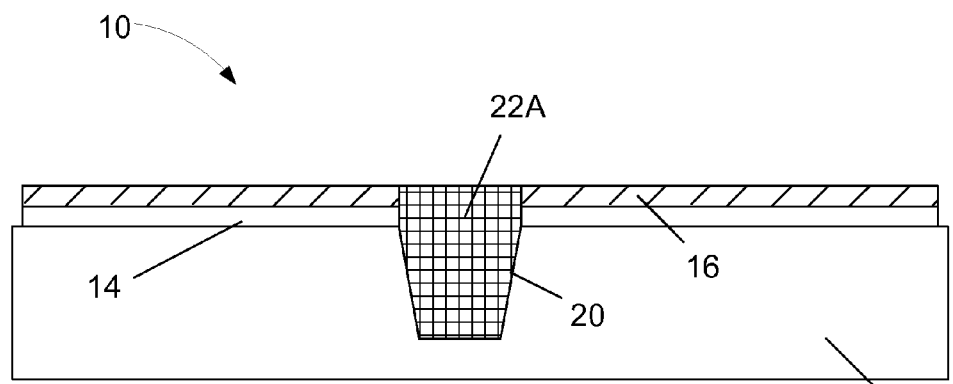
(Prior Art) Figure 2B

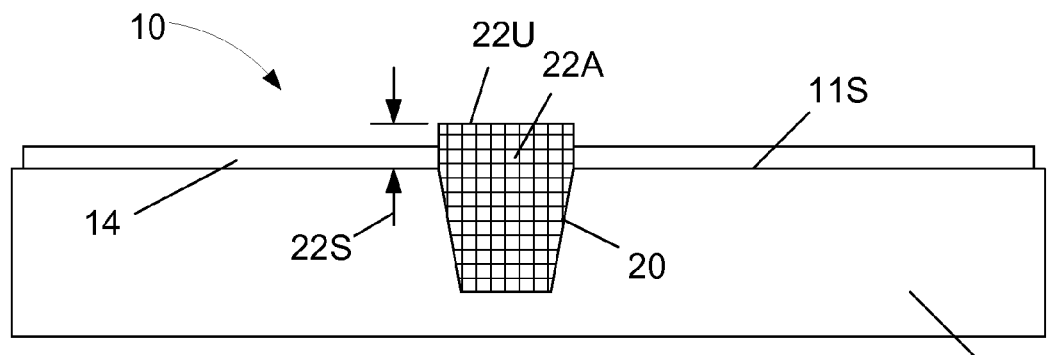
(Prior Art) Figure 2C
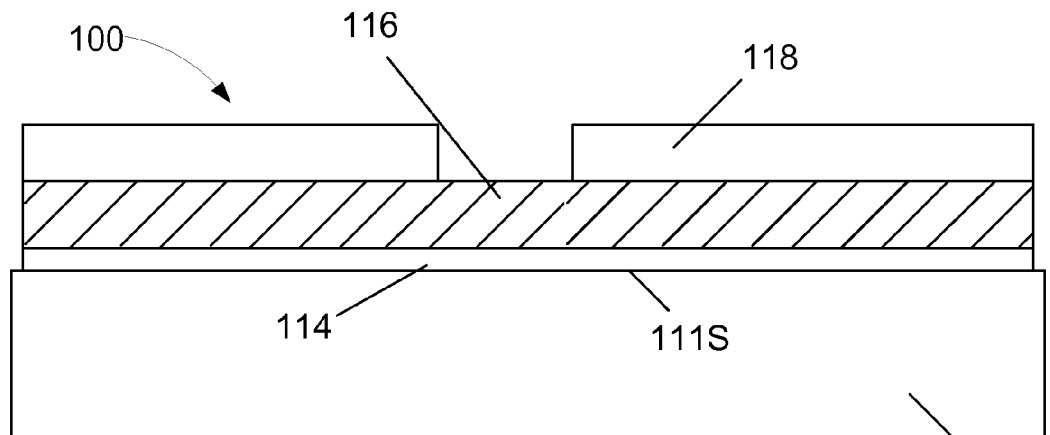
Figure 3A

METHODS OF FORMING ISOLATION STRUCTURES FOR SEMICONDUCTOR DEVICES BY PERFORMING A DRY CHEMICAL REMOVAL PROCESS

BACKGROUND OF THE INVENTION

1. Field of the Invention

Generally, the present disclosure relates to the manufacture of sophisticated semiconductor devices, and, more specifically, to various methods of forming isolation structures, such as trench isolation structures, for semiconductor devices by performing a dry chemical removal process.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To make an integrated circuit on a semiconducting substrate, the various semiconductor devices, e.g., transistors, capacitors, etc., are electrically isolated from one another by so-called isolation structures. Currently, most sophisticated integrated circuit devices employ so-called shallow trench isolation (STI) structures. As the name implies, STI structures are made by forming a relatively shallow trench in the substrate and thereafter filling the trench with an insulating material, such as silicon dioxide.

FIGS. 1A-1G depict one illustrative prior art process flow for forming an isolation structure for a device 10 that involves performing a wet etching or deglaze process. FIG. 1A depicts the device 10 at the point of fabrication where an illustrative screen or pad oxide layer 14 and an illustrative pad nitride layer 16 have been formed above the substrate 11. Also depicted in FIG. 1A is a patterned etch mask layer 18, e.g., a patterned photoresist mask, that may be formed using traditional photolithography tools and techniques. Thereafter, as shown in FIG. 1B, one or more etching processes are performed, such as reactive ion etching processes, through the etch mask layer 18 to pattern the pad nitride layer 16, the pad oxide layer 14 and to form a trench 20 in the substrate 11. The dimensions of the trench 20 may vary depending on the particular application. In current day devices, the trench 20 may have a depth of about 100-500 nm and a width (at the top) of about 30-100 nm. Next, as shown in FIG. 1C, an insulating material 22, such as silicon dioxide, an HDP oxide, a HARP oxide, a flowable oxide material, etc., is formed across the device 10 so as to over-fill the trench 20. Then, as shown in FIG. 1D, one or more chemical mechanical polishing (CMP) processes are performed on the device 10 to remove the portions of the layer of insulating material 22 positioned above the surface 16U of the pad nitride layer 16. This results in the formation of the isolation structure 22A. Thereafter, as shown in FIG. 1E, a wet etching or deglazing process (using, for example, a hot phosphoric acid solution) is performed to insure that the surface 16U of the pad nitride layer 16 is free of any remnants of the layer of insulating material 22. This deglaze process reduces the thickness of the isolation structure 22A, as reflected by the recessed upper surface 22U of the isolation structure 22A, e.g., the deglaze process reduces the thickness of the overall height or thickness of the isolation structure 22A by about 10-80 nm. Then, as shown in FIG. 1F, a wet etching process, i.e., a wet nitride strip process, is performed to remove the pad nitride layer 16. In some cases, an additional etching process, such as a dilute HF etching process, may be performed to remove the pad oxide layer 14, or the pad oxide layer 14 may be left in place or removed at a later point during the fabrication of the device 10. Using the illustrative technique depicted in FIGS. 1A-1F, the step height 22S, i.e., the distance between the upper surface 22U of the isolation structure 22A and the upper surface 11S of the substrate 11 may be about 15-30 nm.

FIGS. 2A-2C depict another illustrative prior art process flow for forming an isolation structure 22A for the device 10 that involves performing a dry deglaze process. FIG. 2A depicts the device 10 at a point of fabrication that corresponds to that depicted in FIG. 1E, i.e., after one or more CMP processes have been performed to remove the portions of the layer of insulating material 22 positioned above the surface 16U of the pad nitride layer 16. Next, as shown in FIG. 2B, a timed, dry, non-selective reactive ion etching (RIE) process is performed to remove portions of the silicon nitride layer 16 and portions of the isolation structure 22A. This dry etching process involves use of etchants that are capable of etching the underlying silicon substrate so the duration of the dry etching process must be controlled so as to avoid such an occurrence, i.e., the etching process must be stopped before the substrate 11 is reached. Accordingly, after the dry etching process is performed, there is typically a very thin layer of the pad nitride layer 16 remaining, e.g., 10-50 nm, as shown in FIG. 2B. Then, as shown in FIG. 2C, a wet etching process, i.e., a wet nitride strip process, is performed to remove the remaining portions of the pad nitride layer 16. As with the earlier method, in some cases, an additional etching process, such as a dilute HF etching process, may be performed to remove the pad oxide layer 14, or the pad oxide layer 14 may be left in place or removed at a later point during the fabrication of the device 10. Using the illustrative technique depicted in FIGS. 2A-2C, the step height 22S of the final isolation structure 22A may also be about 15-30 nm.

Numerous processing operations are performed in a very detailed sequence, or process flow, to form integrated circuit devices, e.g., deposition processes, etching processes, heating processes, masking operations, etc. One problem that arises with current processing techniques is that, after the STI regions are formed, at least portions of the STI regions are exposed to many subsequent etching or cleaning processes that tend to consume, at least to some degree, portions of the STI structures subjected to such etching processes. As a result, the STI structures may not perform their isolation function as intended, which may result in problems such as increased leakage currents, etc. Furthermore, since the erosion of the STI structures is not uniform across a die or a wafer, such STI structures may have differing heights, which can lead to problems in subsequent processing operations. For example, such height differences may lead to uneven surfaces on subsequently deposited layers of material, which may require additional polishing time in an attempt to planarize the surface of such layers. Such additional polishing may lead to the formation of additional particle defects, which may reduce device yields.

The present disclosure is directed to various methods of forming isolation structures that may eliminate or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolation structures, such as trench isolation structures, for semiconductor devices by performing a dry chemical removal process. In one example, a method disclosed herein includes forming a patterned mask comprised of a polish stop layer positioned above a protection layer above a substrate, performing at least one etching process through the patterned mask layer on the substrate to define a trench in the substrate, and forming a layer of silicon dioxide above the patterned mask layer such that the layer of silicon dioxide overfills the trench. In this example, the method further includes removing portions of the layer of silicon dioxide positioned outside of the trench to thereby define an isolation structure, performing a dry, selective chemical oxide etching process that removes silicon dioxide selectively relative to the material of the polish stop layer so as to reduce an overall height of the isolation structure, and performing a selective wet etching process to remove the polish stop layer selectively relative to the isolation region.

In another example, an illustrative method disclosed herein includes forming a patterned mask comprised of a pad nitride (silicon nitride) layer positioned above a pad oxide (silicon dioxide) layer above a substrate, performing at least one etching process through the patterned mask layer on the substrate to define a trench in the substrate, and forming a layer of silicon dioxide above the patterned mask layer such that the layer of silicon dioxide overfills the trench. In this example, the method further includes performing at least one chemical mechanical polishing process to remove portions of the layer of silicon dioxide positioned outside of the trench to thereby define an isolation structure, performing a dry, selective chemical oxide etching process that removes silicon dioxide selectively relative to the pad nitride layer so as to reduce an overall height of the isolation structure, and performing a selective wet etching process to remove the pad nitride layer selectively relative to the isolation region.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict one illustrative prior art method of forming isolation structures for semiconductor devices;

FIGS. 2A-2C depict another illustrative prior art method of forming isolation structures for semiconductor devices; and FIGS. 3A-3G depict novel methods disclosed herein for forming isolation structures for semiconductor devices.

Figure 3B:
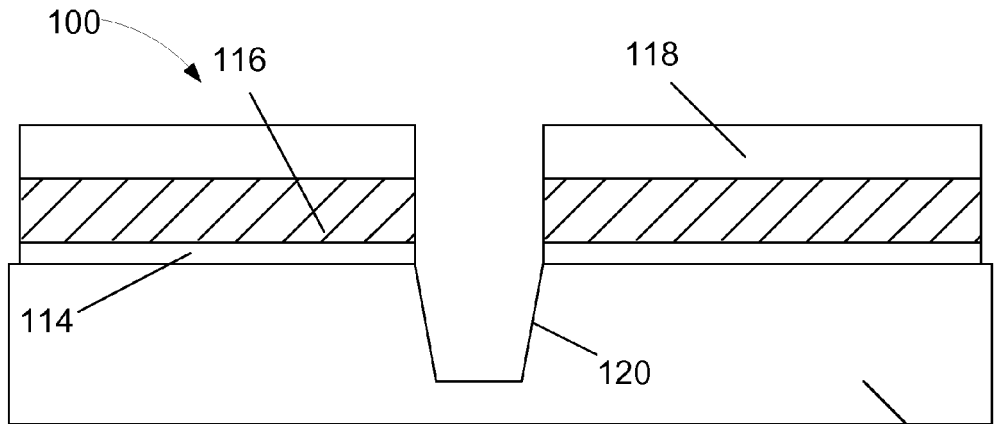

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming isolation structures, such as trench isolation structures, for semiconductor devices by performing a dry chemical removal process. As will be readily apparent to those skilled in the art upon a complete reading of the present application, the present method is applicable to a variety of devices, including, but not limited to, logic devices, memory devices, etc. With reference to the attached drawings, various illustrative embodiments of the methods and devices disclosed herein will now be described in more detail.

FIG. 3A is a simplified view of an illustrative semiconductor device 100 at an early stage of manufacturing. The semiconductor device 100 is formed above an illustrative bulk semiconducting substrate 111 having an upper surface 111S. The substrate 111 may have a variety of configurations, such as the depicted bulk silicon configuration. The substrate 111 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all forms of semiconductor structures. The substrate 111 may also be made of materials other than silicon.

In FIG. 3A, the device 100 is depicted at the point of fabrication where an illustrative protection layer 114, e.g., a screen or pad oxide layer, and a polish stop layer 116, e.g., a pad nitride layer, have been formed above the substrate 111. Also depicted in FIG. 3A is a patterned mask layer 118, e.g., a patterned photoresist mask, that may be formed using traditional photolithography tools and techniques. In one illustrative example, the protection layer 114 may be a pad oxide layer having a thickness on the order of about 5 nm, and it may be formed by performing a thermal growth process. In one illustrative example, the polish stop layer 16 may be a pad nitride layer having a thickness on the order of about 80 nm, and it may be formed by performing a chemical vapor deposition (CVD) process.

Thereafter, as shown in FIG. 3B, in one embodiment, one or more etching processes, such as reactive ion etching processes, is performed through the mask layer 118 to pattern the polish stop layer 116 and the protection layer 114. Alternatively, the masking layer 118 may be removed after the polish stop layer 116 and the protection layer 114 are patterned and the trench 20 may be formed by performing an etching process through the combination of the patterned polish stop layer 116 and the patterned protection layer 114, which collectively may be considered to be a patterned mask layer. The dimensions of the trench 120 may vary depending on the particular application. In current day devices, the trench 120 may have a depth of about 100-500 nm and a width (at the top of the trench) of about 30-100 nm. However, as will be appreciated by those skilled in the art after a complete reading of the present application, the methods disclosed herein are not limited to the formation of so-called shallow trench isolation regions. Rather, the methods disclosed herein may be employed to form any type, configuration or size of isolation region, e.g., field isolation regions. Thus, the methods disclosed herein should not be considered to be limited to the formation of any type, size or configuration of isolation region.

Figure 3C:
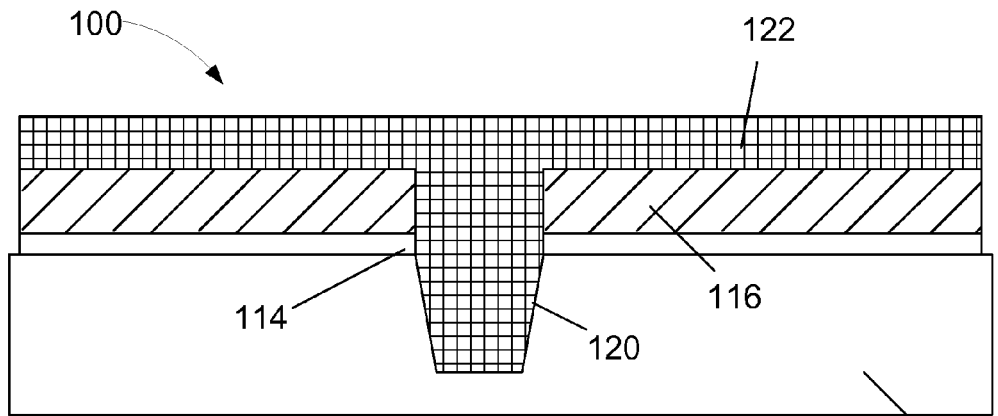

Next, as shown in FIG. 3C, in one illustrative embodiment, a layer of insulating material 122 is formed on the device 100 so as to over-fill the trench 120. The layer of insulating material 122 may be comprised of a variety of different materials, such as, for example, a HDP (High Density Plasma) oxide, a HARP (High Aspect Ratio Process) oxide, a flowable oxide material, etc., and it may be made using a variety of different processes, e.g., chemical vapor deposition (CVD), atomic layer deposition (ALD), etc., or plasma-enhanced versions of those processes. In one illustrative embodiment, the layer of insulating material 122 may be a silicon dioxide material made using either the well-known HDP process or the well-known HARP process. In general, the HARP process is a process available from Applied Materials that employs an ozone-TEOS process chemistry to produce what will be referred to as "HARP silicon dioxide." Silicon dioxide material made using an HDP process will be referred to as "HDP silicon dioxide." In another example, the insulating material 122 may be a spin-on glass (SOG) material that is formed on the wafer using traditional spin-coating tools and techniques so as to overfill the trench 120. In yet other illustrative embodiments, the insulating material 122 may be a flowable oxide material, such as a flowable oxide material offered by AZ Electronics and Applied Materials.

In general, the spin-on glass material that may be employed in some embodiments disclosed herein is a solvent-based liquid that is applied to substrates using a spin-coating process that is typically used to form a thin, solid film exhibiting the properties of silicon dioxide after curing. The basic spin-coating process involves depositing a small amount of the liquid on the substrate 111, rotating the substrate 111 at a high rate to evenly distribute the liquid across the substrate 111, allowing the liquid to form a solid film, performing a low temperature (e.g., <250° C.) heating process to partially cure the SOG material, and then performing a second heating process at a higher temperature (about 400-1100° C.) to fully cure the SOG material.

Figure 3D:
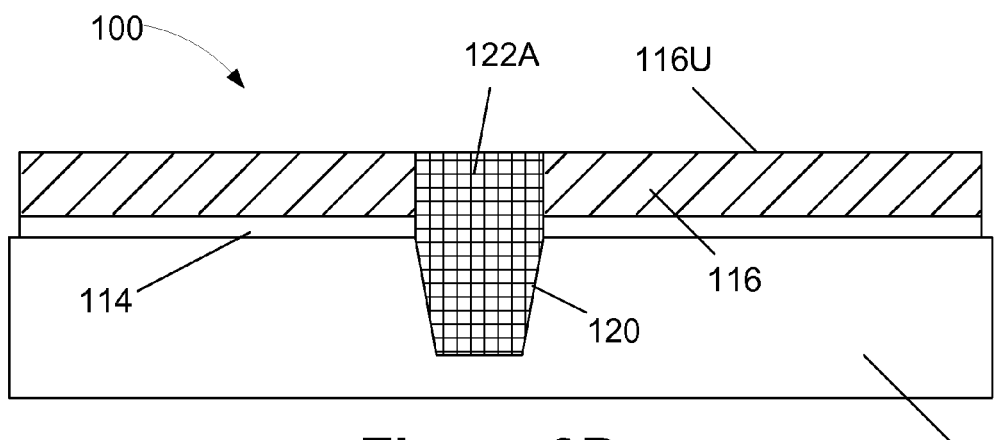

Next, as shown in FIG. 3D, at least one CMP process is performed to remove the portions of the layer of insulating material 122 positioned above the surface 116U of the polish stop layer 116. This results in the formation of the isolation structure 122A.

Figure 3E:
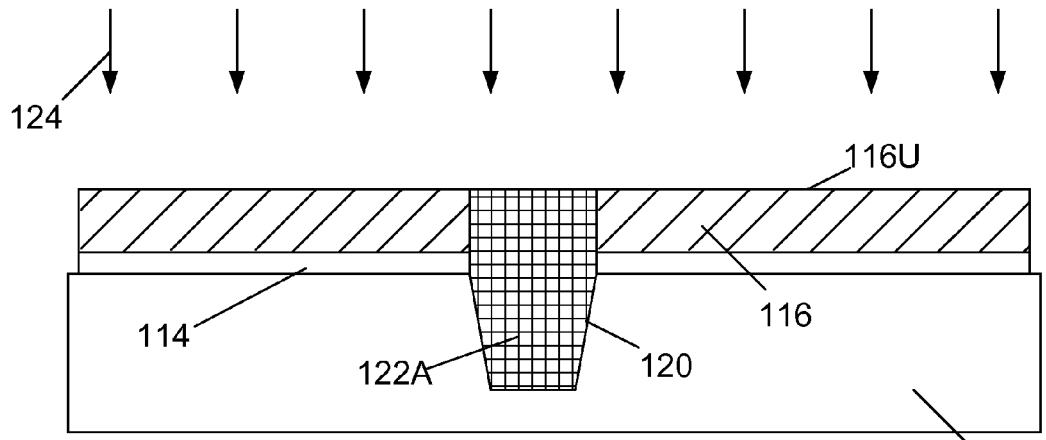

With reference to FIG. 3E, in one illustrative process flow, a wet etching process 124, i.e., a dilute HF acid etch process, is performed to insure that the surface 116U of the polish stop layer 116 is free of the material of the layer of insulating material 122, e.g., to insure that the upper surface of the silicon nitride polish stop layer is free of silicon dioxide. This process also removes any particles from the CMP slurry that may be present on the surface of the polish stop layer 116. Removing such particles by performing, for example, the well-known COR process may tend to reduce the formation of micro-masking defects on various structures of the various devices formed above the substrate 111 as fabrication proceeds. However, performing the wet etching process 124 may not be required in all applications.

Figure 3F:
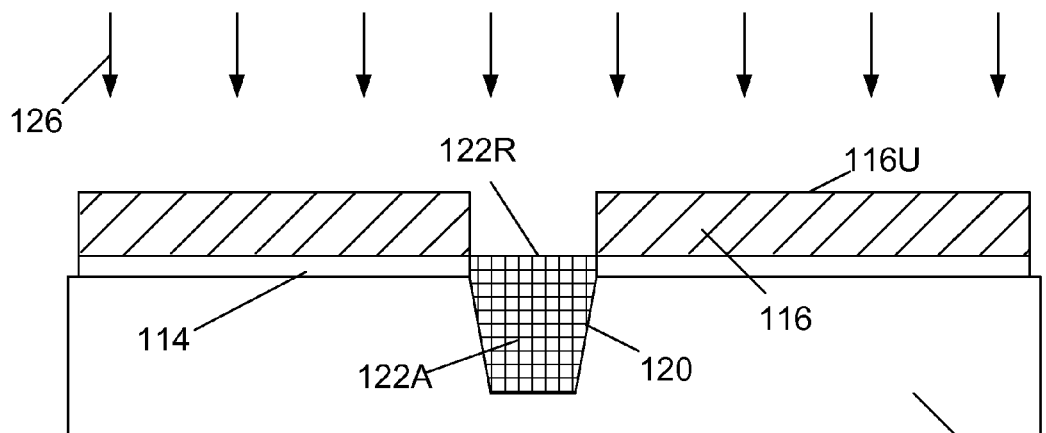

Next, as shown in FIG. 3F, a dry chemical oxide etching process 126 is performed. The dry chemical oxide etching process 126 may be a timed etching process that is selective as between the material of the polish stop layer 116, e.g., silicon nitride, and the silicon dioxide isolation structure 122A. Performing the dry, selective etching process 126 reduces the overall height of the isolation structure 122A, as reflected by the recessed surface 122R, e.g., the dry, selective etching process 126 reduces the overall height or thickness of the isolation structure 122A by about 10-50 nm. Performing the etching process 126 also further insures that the surface 116U of the polish stop layer 116 is free of any remnants of the layer of insulating material 122. The dry chemical oxide etching process 126 is a process that uses the species nitrogen fluoride ($NF_3$) plus ammonia gas with hydrogen ($NH_3/H_2$) or ammonia gas with hydrogen fluoride gas ($NH_3/HF$) in gaseous form to etch silicon dioxide, the material of the isolation structure 122A. The dry chemical oxide etching process 126 produces a solid reaction product that is ultimately sublimated in the process 126. In one illustrative example, the dry chemical oxide etching process 126 may be a plasma based dry cleaning process offered commercially by Applied Materials (Siconi) or the Certas WING process offered by Tokyo Electron. In one particularly illustrative example, the etching process 126 may be the Applied Materials Siconi etching process that is performed using $NH_3$; $NF_3$ at a flow rate of about 5-120 sccm and a temperature of about 140-220° C.

Figure 3G:
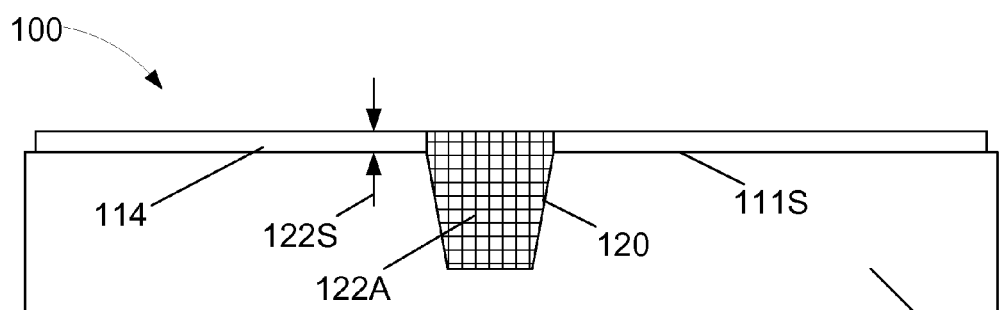

Then, as shown in FIG. 3G, a wet etching processes, i.e., a wet nitride strip process is performed to remove the polish stop layer 116. In some case, an additional etching process, such as a dilute HF etching process, may be performed to remove the protection layer 114, or the protection layer 114 may be left in place or removed at a later point during the fabrication of the device 100. Using the illustrative technique depicted in FIGS. 3A-3G, the step height 122S, i.e., the distance between the upper surface of the isolation structure 122A and the upper surface 111S of the substrate 111 may be about 15-30 nm. If desired, the isolation structure 122A may be subjected to one or more anneal processes to densify the material of the isolation structure 122A and thereby increase its etch resistance.

The methods disclosed herein for forming the illustrative STI structure 122A may provide many advantages as compared to the prior art techniques discussed in the background section of this application. For example, prior to performing the wet etching deglaze process discussed previously in connection with FIGS. 1A-1G, a densification anneal process was performed on the isolation structures to reduce the wet etch rate of the silicon dioxide material. Such densification anneal processes add to the thermal budget of the device, which may result in loss of active silicon and increased leakage currents. The use of the dry, selective deglaze process 126 may permit elimination of such densification anneals as the materials of the isolation structure 122A do not exhibit significantly different etch rates when exposed to the dry, selective etch process, whether or not the silicon dioxide materials are exposed to such a densification anneal process or not.

As another example, for at least some silicon dioxide materials, e.g., HARP based silicon dioxide, performing the wet etching deglaze process discussed previously in connection with FIGS. 1A-1F tended to produce different results depending upon the spacing of the isolation regions on the substrate. That is, performing such a wet deglaze process on densely packed isolation regions tended to produce different stress levels (and accordingly etch rates) for the HARP based silicon dioxide material as compared to isolated or non-densely packed isolation structures. Such a situation could produce isolation regions having differing step heights. In contrast, performing the dry, selective deglaze process 126 described above, there was no significant difference in the stress levels observed in the silicon dioxide material irrespective of whether the isolation structure 122A was a densely packed structure or an isolated structure.

Performing the dry, selective deglaze process 126 as part of the process of forming the isolation regions 122A also enables a device manufacturer to (1) skip the traditional dilute HF acid process that is performed after the dry deglaze process described above in connection with FIGS. 2A-2C to remove the residuals of the RIE processes from the surface of the device, (2) produces isolation regions 122A with very low or even negative step heights 122S (the dry deglaze process shown in FIGS. 2A-2C cannot be used to produce negative step heights for fear of damage to the substrate); and (3) permits better process control, e.g., feed forward and/or feed backward process control loops on a wafer or lot basis.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a patterned mask layer above a semiconducting substrate, said patterned mask layer comprising a polish stop layer positioned above a protection layer;
   performing at least one etching process through said patterned mask layer on said substrate to define a trench in said substrate;
   forming a layer of silicon dioxide above said patterned mask layer such that said layer of silicon dioxide overfills said trench;
   removing portions of said layer of silicon dioxide positioned outside of said trench and above an upper surface of said polish stop layer to thereby define an isolation structure with an upper surface that is substantially planar with said upper surface of said polish stop layer;
   performing a dry, selective chemical oxide etching process that removes silicon dioxide selectively relative to said polish stop layer so as to remove portions of said isolation structure and define a reduced height isolation structure having a recessed upper surface that is below a level of said upper surface of said polish stop layer; and
   after forming said reduced height isolation structure, performing a selective wet etching process to remove said polish stop layer selectively relative to said reduced height isolation region.

2. The method of claim 1, wherein said reduced height isolation structure is one of a shallow trench isolation structure or a field isolation structure.

3. The method of claim 1, wherein forming said layer of silicon dioxide comprises performing one of a chemical vapor deposition (CVD) process, a spin-coating process, a high density plasma (HDP) deposition process, and a high aspect ratio deposition (HARP) process to form said layer of silicon dioxide.

4. The method of claim 1, wherein removing said portions of said layer of silicon dioxide positioned outside of said trench and above said upper surface of said polish stop layer comprises performing at least one chemical mechanical polishing process to remove said portions of said layer of silicon dioxide positioned outside of said trench and above said upper surface of said polish stop layer.

5. The method of claim 1, wherein said protection layer is comprised of silicon dioxide and said polish stop layer is comprised of silicon nitride.

6. The method of claim 1, wherein performing said dry, selective chemical oxide etching process comprises performing said dry, selective chemical oxide etching process using NH3 or NF3 at a flow rate that falls within the range of 5-120 sccm and a temperature that falls within the range of 140-220° C.

7. The method of claim 1, wherein forming said patterned mask layer comprises:
   forming a patterned photoresist etch mask above said polish stop layer; and
   performing at least one etching process through said patterned photoresist etch mask on said polish stop layer and said protection layer to thereby define said patterned mask layer.

8. The method of claim 1, further comprising, after performing said selective wet etching process, performing another etching process to remove said protection layer.

9. A method, comprising:
   forming a patterned mask layer above a semiconducting substrate, said patterned mask layer comprising a pad nitride layer comprised of silicon nitride positioned on a pad oxide layer that is formed on said substrate;
   performing at least one etching process through said patterned mask layer on said substrate to define a trench in said substrate;
   forming a layer of silicon dioxide above said patterned mask layer such that said layer of silicon dioxide overfills said trench;
   performing at least one chemical mechanical polishing process to remove portions of said layer of silicon dioxide positioned outside of said trench and above an upper surface of said pad nitride layer to thereby define an isolation structure with an upper surface that is substantially planar with said upper surface of said pad nitride layer;

performing a dry, selective chemical oxide etching process that removes silicon dioxide selectively relative to said pad nitride layer so as to remove portions of said isolation structure and define a reduced height isolation structure having a recessed upper surface that is below a level of said upper surface of said pad nitride layer; and after forming said reduced height isolation structure, performing a selective wet etching process to remove said pad nitride layer selectively relative to said reduced height isolation region.

10. The method of claim 9, wherein forming said layer of silicon dioxide comprises performing one of a chemical vapor deposition (CVD) process, a spin-coating process, a high density plasma (HDP) deposition process, and a high aspect ratio deposition (HARP) process to form said layer of silicon dioxide.

11. The method of claim 9, wherein performing said dry, selective chemical oxide etching process comprises performing said dry, selective chemical oxide etching process using NH3 or NF3 at a flow rate that falls within the range of 5-120 sccm and a temperature that falls within the range of 140-220° C.

12. The method of claim 9, wherein forming said patterned mask layer comprises:

forming a patterned photoresist etch mask above said pad nitride layer; and performing at least one etching process through said patterned photoresist etch mask on said pad nitride layer and said pad oxide layer to thereby define said patterned mask layer.

13. The method of claim 9, further comprising, after performing said selective wet etching process to remove said pad nitride layer, performing another etching process to remove said pad oxide layer.

* * * * *